(12) United States Patent
Lisec et al.

(10) Patent No.: US 9,221,217 B2
(45) Date of Patent: Dec. 29, 2015

(54) METHOD FOR PRODUCING A THREE-DIMENSIONAL STRUCTURE AND THREE-DIMENSIONAL STRUCTURE

(75) Inventors: Thomas Lisec, Itzehoe (DE); Mato Knez, Bobingen (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 48 days.

(21) Appl. No.: 13/983,637

(22) PCT Filed: Feb. 3, 2012

(86) PCT No.: PCT/EP2012/000696
§ 371 (c)(1),
(2), (4) Date: Oct. 8, 2013

(87) PCT Pub. No.: WO2012/104106
PCT Pub. Date: Aug. 9, 2012

(65) Prior Publication Data
US 2014/0023849 A1    Jan. 23, 2014

(30) Foreign Application Priority Data

Feb. 4, 2011  (DE) .......................... 10 2011 010 899

(51) Int. Cl.
| | | |
|---|---|---|
| B29C 67/00 | (2006.01) | |
| C23C 16/01 | (2006.01) | |
| C23C 16/04 | (2006.01) | |
| C23C 16/40 | (2006.01) | |
| C23C 16/455 | (2006.01) | |
| C23C 16/56 | (2006.01) | |
| B81C 99/00 | (2010.01) | |

(52) U.S. Cl.
CPC .......... *B29C 67/0074* (2013.01); *B81C 99/0085* (2013.01); *C23C 16/01* (2013.01); *C23C 16/045* (2013.01); *C23C 16/403* (2013.01); *C23C 16/45525* (2013.01); *C23C 16/56* (2013.01); *B81C 2201/034* (2013.01); *Y10T 428/249955* (2015.04)

(58) Field of Classification Search
None
See application file for complete search history.

(56) References Cited

U.S. PATENT DOCUMENTS

| | | | | |
|---|---|---|---|---|
| 6,261,469 B1 * | 7/2001 | Zakhidov et al. | ............... | 216/56 |
| 8,071,160 B2 * | 12/2011 | Chinn | ................... | H05K 3/284 |
| | | | | 427/126.3 |
| 2003/0048172 A1 * | 3/2003 | Meigs et al. | .................. | 338/308 |

(Continued)

FOREIGN PATENT DOCUMENTS

| | | |
|---|---|---|
| DE | 10 2007 029 445 A1 | 12/2008 |
| WO | WO 99/58167 | 11/1999 |

(Continued)

*Primary Examiner* — Joseph Miller, Jr.
(74) *Attorney, Agent, or Firm* — Jacobson Holman, PLLC.

(57) ABSTRACT

The invention relates to a method for producing a three-dimensional structure. The method according to the invention comprises the following steps: applying to or introducing into a carrier element (1; 7; 16) particles (2), a plurality of at least partially interlinked cavities being formed between the particles (2) and the particles (2) coming into contact in points of contact, and interconnecting the particles (2) in the points of contact by coating the system consisting of particles and the carrier element, the coat (4) produced during coating penetrating the cavities at least to some extent. The method according to the invention allows the production of three-dimensional structures with little effort.

16 Claims, 4 Drawing Sheets

(56) References Cited

U.S. PATENT DOCUMENTS

| | | |
|---|---|---|
| 2005/0118449 A1* | 6/2005 | Derderian et al. ............ 428/615 |
| 2006/0057287 A1* | 3/2006 | Foss et al. .................. 427/248.1 |
| 2007/0178229 A1* | 8/2007 | Bergendahl ......... C23C 16/4417 427/127 |
| 2008/0193739 A1 | 8/2008 | Dickey et al. |
| 2013/0251900 A1* | 9/2013 | Zinn ................... C04B 35/5622 427/215 |

FOREIGN PATENT DOCUMENTS

| | | |
|---|---|---|
| WO | WO 02076631 A2 | 10/2002 |
| WO | WO 2007/042373 A1 | 4/2007 |

* cited by examiner

METHOD FOR PRODUCING A THREE-DIMENSIONAL STRUCTURE AND THREE-DIMENSIONAL STRUCTURE

This is a national stage of PCT/EP12/000696 filed Feb. 3, 2012 and published in German, which has a priority of German no. 10 2011 010 899.8 filed Feb. 4, 2011, hereby incorporated by reference.

The invention relates to a method for producing a three-dimensional structure.

A variety of possibilities for producing three-dimensional structures are known in the prior art. For instance, various injection molding methods are cited. One example of an injection molding method with which particularly precise structures may be produced is powder injection molding.

However, in many technical fields there is also a need for producing porous three-dimensional structures in a simple and precise manner.

The object of the invention is therefore to suggest a method for producing a three-dimensional structure, which method makes it possible to produce porous structures and is not complex to execute.

This object is attained using a method having the features of claim 1 and using a three-dimensional structure having the features of claim 18. Advantageous refinements and embodiments result from the features in the subordinate claims.

In accordance with the invention, first particles are added or applied to a carrier element. A plurality of at least some interlinked cavities are formed between the particles. The particles come into contact with one another at points of contact. The particles may be added or applied for instance using knife coating. The particles may have any shape or size.

Once the particles have been added or applied, they are connected to one another at the points of contact. To this end, the arrangement of particles and carrier element is coated, at least some of the cavities being penetrated by the layer produced during the coating process. The coating is preferably solid at room temperature. It is particularly preferred that the coating is solid in the entire temperature range intended for proper use of the three-dimensional structure. Thus, the coating is preferably not embodied as a liquid. In addition, the coating preferably has negligible vapor pressure at room temperature, that is, it does not evaporate at room temperature within the normal period of use for the three-dimensional structure. Thus it is a stable non-volatile layer. In order to provide a reliable coating, the particles are dry prior to and during application of the coating.

Preferably any materials that may be deposited by means of CVD and preferably by means of ALD or AVD may be used for the coating material. It is particularly preferred that inorganic oxides or metals may be deposited. Aluminum oxide has proved especially suitable.

Depending on the embodiment, the cavities may remain open during the coating process, i.e. although the coating effects a connection between the particles, the majority of cavities between the particles remain interlinked with one another. Alternatively, at least some of the cavities may be closed by the layer so that the cavities form closed pores.

It should be noted that it is not necessary for all of the added particles to be connected to one another. Likewise, it is possible for just some of the particles to be connected during the coating process, that is, it is possible for the layer produced during the coating process to penetrate some of the cavities and it also possible for the layer to penetrate all of the cavities. If essentially all of the particles are connected to one another and thus essentially all of the cavities have been penetrated, a layer generally also forms on the area of the carrier element to which or onto which the particles are added or applied.

Conducting or non-conducting particles may be used depending on the field of application. Conducting or non-conducting materials may also be used for the coating. Use of conducting materials is particularly preferred if the three-dimensional structure is embodied as an element of a microelectronic component.

It is possible to use chemical vapor deposition (CVD) and in particular atomic layer deposition (ALD) or atomic vapor deposition (AVD) as the method for applying the coating in a relatively uncomplicated and uniform manner. Thus, the coating is preferably deposited from the gas phase. In atomic layer deposition, two different components in the gas state are alternately introduced, each accumulating on the surface of the particles or carrier element. In each process, a continuous layer is formed that is essentially one atom thick. This produces a particularly uniform layer. Layer thickness is controlled primarily by how often adding a first component is alternated with adding a second component.

A thickness of the applied layer may particularly preferably be between one atom layer and 5 between 5 nm and 1 µm, or between 50 nm and 300 nm. Thinner layers have the advantage that they may be produced in a short period of time, a porous structure with a particularly low density and high porosity being produced. In contrast, layer thicknesses that are in the upper range of those listed provide a particularly solid and reliable connection.

It should be noted that due to the coating the cavities formed when the particles are added or applied increase in volume by a negligible amount. The volume of the layer may preferably account for less than 1% the volume of the cavities.

In the method, the particles may be applied or added in a random orientation and arrangement; ordered application that would be associated with greater complexity is therefore not necessary.

The particles preferably have a relatively small diameter of less than 20 µm, preferably less than 10 µm, and particularly preferably less than 5 µm, so that it is possible for the three-dimensional structures to be embodied very precisely even with a random arrangement of the particles.

To prevent damage to the carrier element and/or the particles during the coating process, it is advantageous when the particles and the carrier element are heat-resistant up to a temperature of at least 100° C., preferably 150° C. or 200° C. Heat resistance of this magnitude results in especially few limitations with regard to the coating methods that may be used. At the same time, the high heat-resistance makes it possible to perform the method more rapidly without it being necessary to worry about the particles being damaged and/or the carrier element overheating.

In order to prevent loss or a reduction in the porous properties, when the particles are connected they are advantageously essentially not irreversibly deformed.

In one particularly preferred embodiment, a particle mixture having particles made of at least two different materials is added. The materials differ from one another preferably with respect to at least one physical or chemical property. For instance, the hardness, electrical conductivity, coefficient of thermal expansion, and/or electrochemical parameters of the particles may be selected to be different. It is possible to adapt and adjust the properties of the three-dimensional structure precisely and reliably to desired requirements by using different materials with different mixing ratios and possibly different chemical and physical properties.

For instance, the coefficient of thermal expansion for the particles or particle mixture may be adjusted to the coefficient of thermal expansion of the carrier element. Likewise, the coefficient of thermal expansion for the particles or particle mixture may also be adjusted to a component in which the connected particles are to be arranged.

Depending on the embodiment, either only some of the particles or essentially all of the added or applied particles are connected to one another. Connecting essentially all of the particles is especially advantageous when a structure of the carrier element is to be molded.

Prior to coating, the particles may be arranged in loose contact with one another. Thus no other additional method steps are necessary for producing a connection between the particles before the coating is applied. After coating the three-dimensional structure formed in this manner is solid.

Depending on the embodiment of the method, a substrate having an applied or added height structure may be used for the carrier element. This structure is then preferably molded by the connected particles. Among other things, depressions or cavities may be added to the substrate as a height structure. Likewise, a layer arrangement with structuring may be applied to the substrate. A substrate with depressions may be used in electronic circuits in particular in applications for the three-dimensional structure. The connected particles may effect a conductive connection between two components that are arranged on opposing sides of the depression.

Substrates made of silicon, glass, or ceramic have proved to be particularly suitable substrates. The substrate may be embodied for instance as a wafer or plate. Silicon wafers are particularly suitable for use in the field of microelectronics.

Elements that are significantly larger than the particles are embedded in one preferred embodiment so that during the coating process they are connected to the particles and the carrier element. For instance, chips, especially thinned chips, may be embedded. The coated particles may then act as contacts for the chips. This makes simple stacking and connecting of thinned chips possible.

Depending on the embodiment, a cover layer that is intended to essentially completely close the shallow cavities and/or to form a closed layer on an uppermost layer of particles may be applied to at least part of the arrangement made of particles and carrier element. The cover layer is preferably subsequently planarized, for instance by grinding or polishing. When the cover layer is planarized, larger embedded elements such as for instance chips may be re-exposed.

In another embodiment, after the particles have been coated and connected, the carrier element and possibly the particles that have remained uncoated are removed, at least in part. These may be removed for instance by means of an etching step. A wide variety of different three-dimensional structures may be produced by removing at least part of the carrier element, e.g. a porous membrane comprising the connected particles may be formed by removing some of the carrier element. This membrane may be retained for instance by a frame formed by a remainder of the carrier element. Alternatively, for producing a membrane a self-supporting structure applied to the remaining substrate may be formed by removing part of the carrier element.

Alternatively, it is also possible to remove the carrier element completely. The connected particles may then be applied to a different substrate. This makes it possible to mold a surface geometry of the carrier element, the molded connected particles being transferred to a different substrate.

In another embodiment, the particles may be applied to another material, at least some of the connected particles then being removed, preferably by etching. Thus, the particles themselves may be used as a sacrificial layer, it being possible to remove the sacrificial layer particularly simply and rapidly due to the porous structure created by the particles.

In addition to a method for producing a three-dimensional structure as described in the foregoing, the invention furthermore relates to a three-dimensional structure produced using such a method. It is specifically distinguished from conventionally produced three-dimensional structures in that it includes a plurality of particles that are connected to one another by a layer. The particles are not arranged in a single layer, but rather the size of a space occupied by the connected particles is preferably significantly larger in all directions than the diameter of an individual particle. The space occupied by the connected particles is preferably larger in every spatial direction than five times the diameter of the particles.

Exemplary embodiments of the invention shall be explained in greater detail in the following using the figures.

Figure 5:
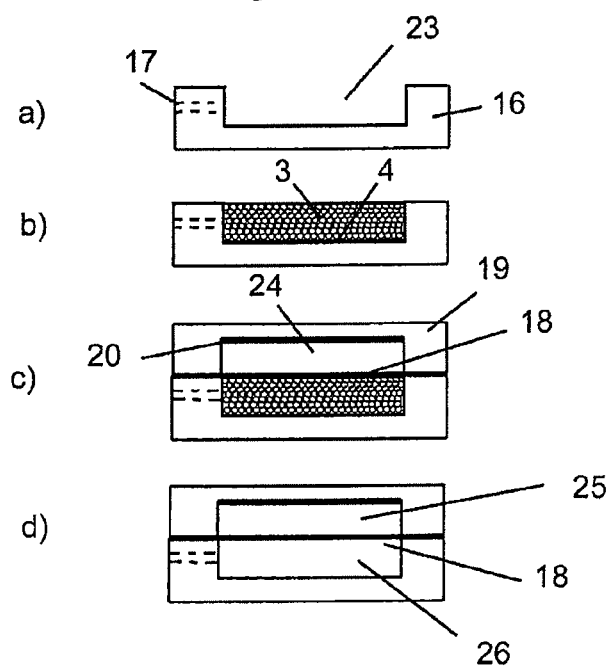
Figure 6:
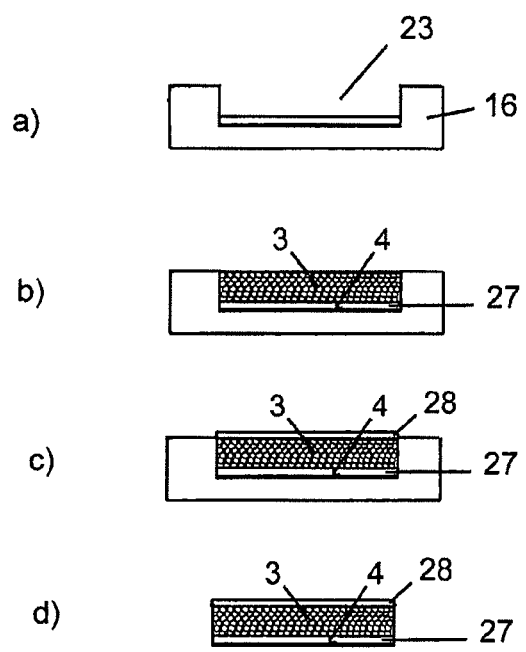

FIG. 5 depicts different steps in accordance with a fifth exemplary embodiment of the method for producing a three-dimensional structure in which the particles are used as a sacrificial material; and, FIG. 6 depicts different steps in accordance with a sixth exemplary embodiment of the inventive method for producing a three-dimensional structure, in which larger bodies are embedded between the particles.

Figure 1:
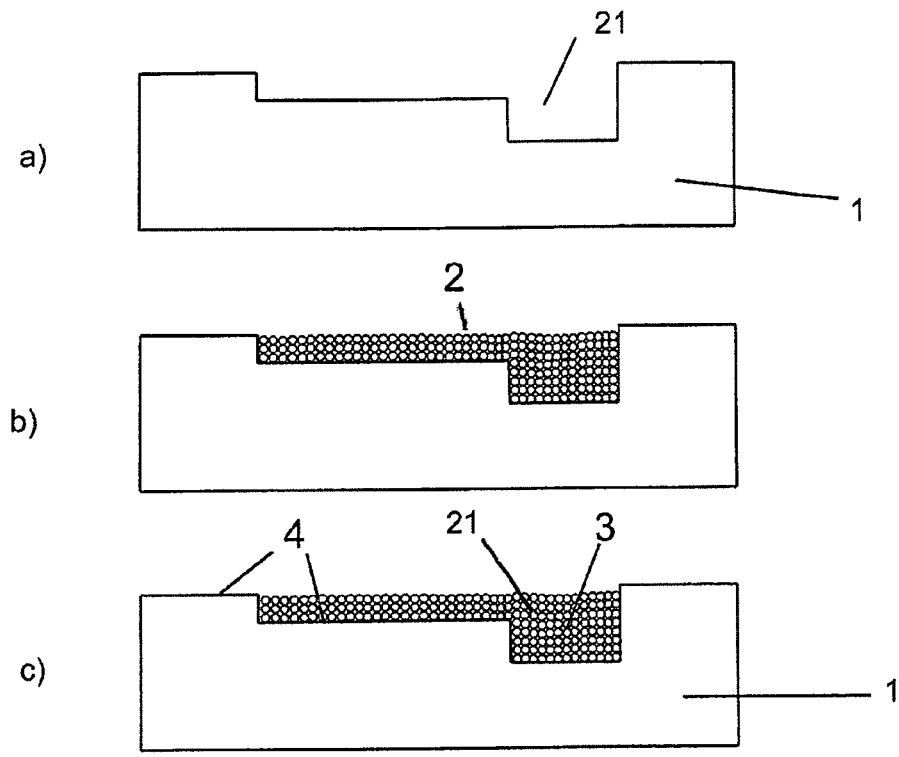
FIG. 1 depicts different steps for in accordance with a first exemplary embodiment of the inventive method for producing a three-dimensional structure.

FIG. 1 clarifies a first embodiment of the inventive method. As may be seen in FIG. 1c), the method is used to create a three-dimensional structure with a silicon carrier 1 that has a cavity 21 filled with interlinked particles 3.

To this end, in a first method step, a silicon substrate 1 is provided into which a depression 21 is added. Then, as may be seen in FIG. 1b), the depression 21 is filled with particles 2, e.g. by pouring the particles thereon and/or by knife coating. The arrangement and orientation of the particles 2 to one another is random.

In a subsequent method step a coating with a thickness of about 100 μm is applied using a chemical vapor deposition (CVD) method, more precisely, using atomic layer deposition. Using the coating material, it is not just one layer 4 that is formed on the bottom of the depression and adjacent to the depression, but rather the particles also accumulate. Since the particles are in contact with one another at points of contact after the depression 21 has been filled, the accumulation of the coating material leads to the particles being connected to one another so that they form a cohesive body made of consolidated particles 3. The particles and the carrier element are heated to about 100 to 200° C. during the coating process. The materials for the particles and carrier element are appropriately temperature-resistant.

It should be noted that the scale in the figures is only for the purposes of clarification. The depression may have for instance a depth of about 400 μm and a width of about 80 μm. Aluminum oxide particles having a diameter of 3 μm may be sued for the particles, for instance. Thus there are generally significantly more particles arranged on top of one another than are shown in the figures. In principle the shape and diameter of the particles may be freely selected, however.

Figure 2:
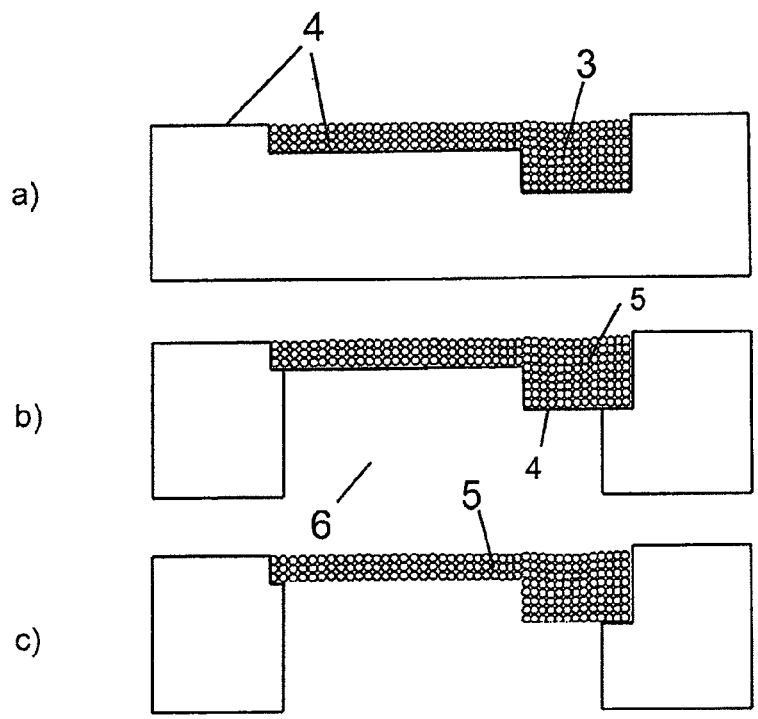
FIG. 2 depicts different steps in accordance with a second exemplary embodiment of the inventive method for producing a three-dimensional structure, in which a porous membrane is created.

Another exemplary embodiment of the inventive method shall be explained in the following using FIG. 2. In this embodiment, first a substrate with a filled depression 21 is produced, as was described for FIG. 1. However, in this exemplary embodiment the process parameters for the ALD method may be selected such that the ALD layer 4 does not completely penetrate the cavities, i.e. the particles are not necessarily all connected to one another. Then, as shown in FIG. 2b), part of the substrate 1 is removed so that the compacted particles are merely fixed on the edge of the substrate, while in a center area 6 they form a self-supporting membrane 5. If a few of the particles are not connected, they are removed in this method step. The thickness of the self-supporting membrane 5, which may be for instance about 40 µm, is then determined by a penetration depth for the ALD layer into the depression 21 that is filled with particles 2. The self-supporting membrane 5 may still be covered on its back side with the essentially closed ALD layer 4, which formed on the surface of the substrate 1 when the coating was applied, especially if essentially all of the particles were connected and the coating material penetrated the cavities down to the bottom of the depression 21.

If present, this ALD layer 4 will be removed in the next method step. It may be removed for instance by means of ion beam etching. The finished three-dimensional structure after this method step is illustrated in FIG. 2c).

Figure 3:
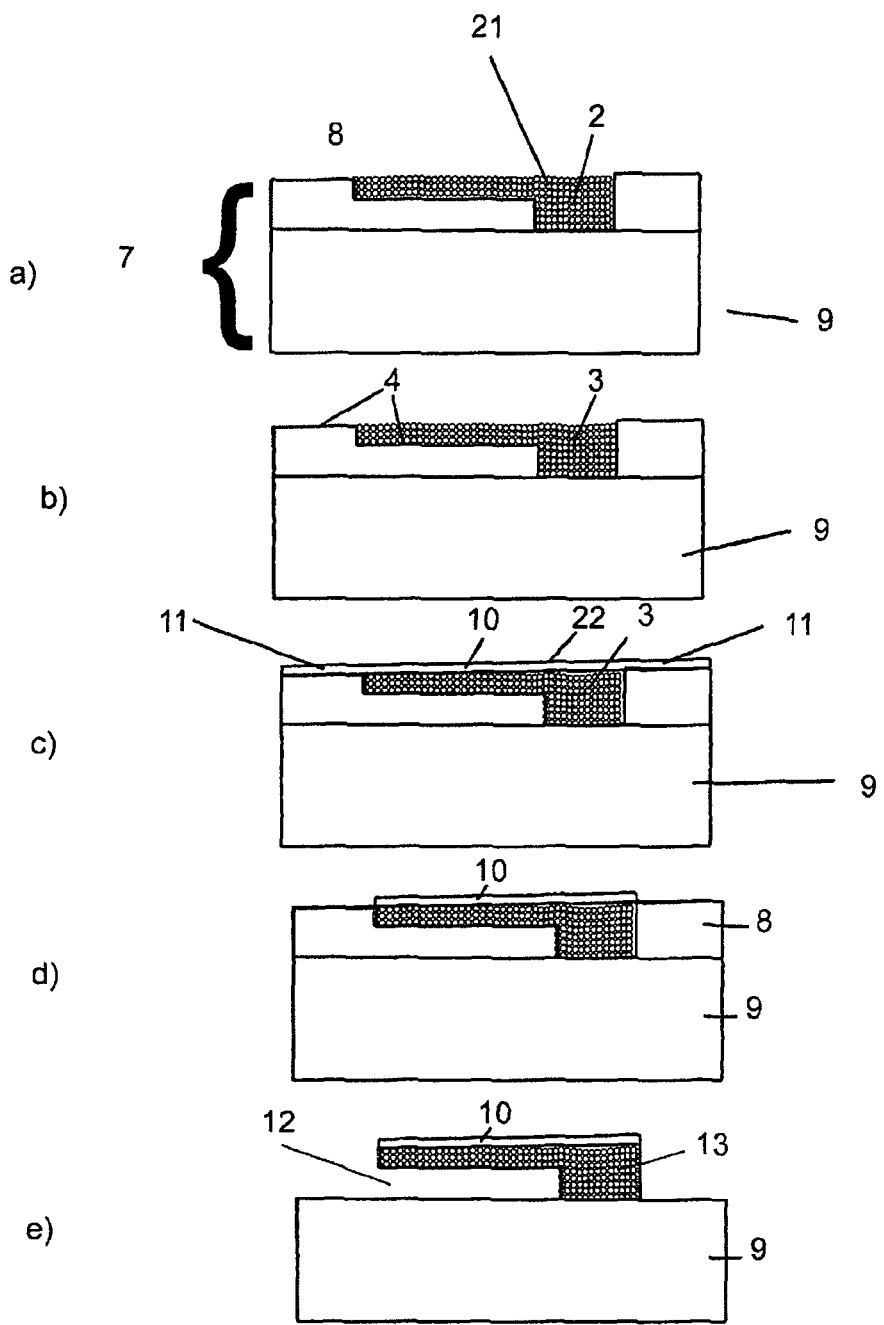
FIG. 3 depicts different steps in accordance with a third exemplary embodiment of the inventive method in which a self-supporting structure is produced.

FIG. 3 depicts a workpiece after various steps of a method in accordance with a third preferred embodiment of the invention. A carrier element 7, comprising a silicon substrate 9 and a sacrificial material 8, is used in this method variant. The sacrificial material 8, for instance a photoresist, is not applied with a continuously uniform thickness so that a depression 21 is formed. As has already been explained in the context of FIG. 1, particles added to this depression. In this embodiment, as well, a coating is then deposited by means of an ALD method. Then a layer 22 that may comprise for instance a metal is applied to the top of the particles and the sacrificial material. Shallow cavities between particles 2 are closed by the layer 22. Areas 11 of the layer 22 that lie directly on the sacrificial material are then removed, while the layer 22 in the area 10 of the connected particles 3 are planarized, for instance using grinding or polishing. The areas 11 of the layer 22 may be removed by ion beam etching. However, any other methods are suitable that permit precise local removal of material without physical stresses that are too strong.

In the next method step, which is depicted in FIG. 3, part e), the sacrificial material 8 is removed, for instance by means of a chemical etching method. Now the connected particles 3 and the applied layer 22 form a self-supporting structure 13, the structure 13 running in an area 12 at a distance from the substrate 9.

Figure 4:
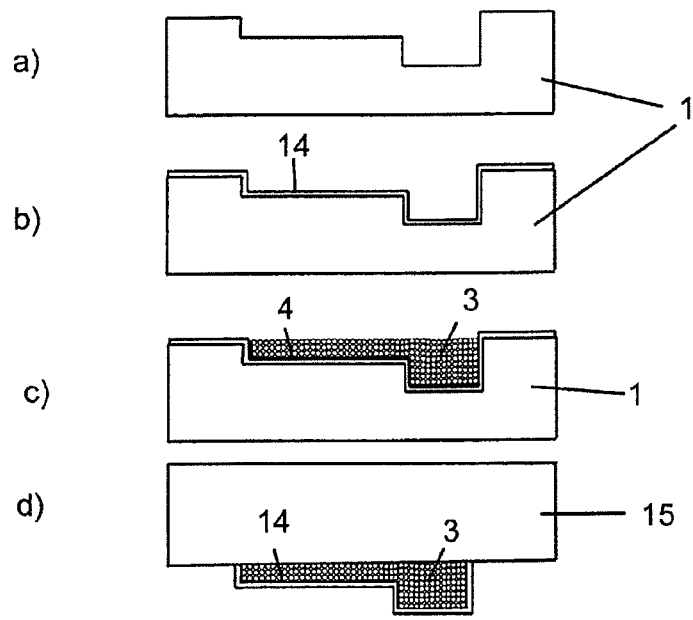
FIG. 4 depicts different steps in accordance with a fourth exemplary embodiment of the inventive method in which connected particles are transferred to a different substrate for creating a three-dimensional structure.

Another advantageous embodiment of the inventive method is clarified in FIG. 4. The first method steps for the method, the results of which are illustrated in parts a) through c) of FIG. 4, are very similar to the method in FIG. 1. In contrast thereto, however, a metal layer 14 is applied to the top of the substrate 1 before the particles 2 are added. After the depression 21 has been filled with particles 2 and the ALD layer 4 has been applied for forming a body of consolidated particles 3, the substrate 1 is removed. This may be accomplished for instance by means of a chemical etching step. To this end, an acid is selected that dissolves the substrate 1 but does not react with the metal layer 14, the consolidated particles 3, or the ALD layer 4. Once the substrate 1 has been removed, the body formed by the consolidated particles 3 and coated with the metal layer 14 is applied to another substrate 15 for forming the finished three-dimensional structure, the body being arranged such that the metal layer 14 is oriented away from other substrates 15.

A fifth advantageous embodiment of the inventive method may be realized using the steps depicted in FIG. 5. In this method variant, first a substrate 16 is prepared with a depression 23 that is connected to a bore 17. The particles are then added to the depression 23 and connected by means of an ALD layer. The applied ALD layer next to the interlinked particles 3 is removed so that the coating material is now only present between the particles and on the bottom of the depression 23. Then a layer 18 is applied that, because the ALD layer in these areas was already previously removed, is disposed directly on the substrate 16 adjacent to the connected particles 3 and completely covers the connected particles in the area of the depression 23.

To produce a particularly smooth layer 18, prior to applying this layer (especially prior to removing the ALD layer adjacent to the interlinked particles), the surface of the particles may be planarized by applying a cover layer and then polishing, as was already explained in the connection with the cover layer 22 in FIG. 3. The cover layer is then removed together with the ALD layer adjacent to the area in which the particles were added.

In a subsequent method step, another substrate 19 that has a hollow 24 and a metal layer 20 on the top of the hollow 24 is applied to the substrate 16 with the particles 3 arranged in the depression 23 and the layer 18.

In the next method step the connected particles 3, the ALD layer 4, and the cover layer (if any) previously applied to enable a smooth layer 18 are removed from the three-dimensional structure formed in this manner. This may be accomplished for instance using an etching step. It is possible to use etching to remove the particles rapidly due to the porosity, even though the particles are only accessible through the bore 17.

Overall this creates a housing comprising the substrates 16 and 19, the housing having a sealed chamber 25 and a chamber 26 that communicates with the surroundings via the bore 17. Arranged between the chambers 25 and 26 is the layer 18 that in this example forms a gas-tight self-supporting membrane. The layer 18, together with the metal layer 20, forms a capacitor, the capacity of the capacitor changing as a function of ambient pressure so that the arrangement depicted in FIG. 5d) may be used as a pressure sensor.

A sixth exemplary embodiment of the inventive method is explained using FIG. 6. In this exemplary embodiment, the same method steps are performed as in the first exemplary embodiment. In addition, however, prior to adding the particles 2, a thinned chip 27 is arranged on the bottom of the depression 21. After the particles have been connected, another chip 28 is placed onto the connected particles 3 and fixed thereto. Then the substrate 1 and optionally the ALD layer 4 are removed so that the two chips 27 and 28 with the connected particles 3 arranged therebetween remain as a three-dimensional structure.

It should be noted that in the aforesaid exemplary embodiments the diameters of the particles may be varied in nearly any desired manner. The thickness of the ALD layer may also be varied across a wide range. Depending on the thickness of the ALD layer and the size of the particles, cavities existing between the particles may be interlinked so that a porous structure having open pores is formed, or at least some of them may be closed so that the connected particles form a closed pore material.

The invention claimed is:

1. Method for producing a three-dimensional structure comprising:
a first step of applying unattached particles onto or into a carrier element, thereby forming a plurality of at least some interlinked cavities between the particles and the particles coming into contact with one another at points of contact,
a second step of coating the arrangement of particles and carrier element, at least some of the cavities penetrated by a layer produced during the coating step, and at least part or all of the particles being connected to one another at the points of contact,
wherein another material is applied to connected particles, at least some of the connected particles, or at least a part of the carrier element, being subsequently removed.

2. Method in accordance with claim 1, wherein the coating process is performed by means of a CVD method.

3. Method in accordance with claim 1, wherein said layer has a thickness of between one atom layer and 5μm, preferably between 5 nm and 1 μm, and particularly preferably between 50 nm and 300 nm.

4. Method in accordance with claim 1, wherein the particles are applied or added in a random orientation and arrangement.

5. Method in accordance with claim 1, wherein the particles and/or the carrier element are heat-resistant up to a temperature of at least 100° C., preferably 150° C. or 200° C.

6. Method in accordance with claim 1, wherein the particles when connected are essentially not irreversibly deformed.

7. Method in accordance with claim 1, wherein a particle mixture having particles made of at least two different materials is added.

8. Method in accordance with claim 7, wherein essentially all applied or added particles are joined to one another by the coating.

9. Method in accordance with claim 1, wherein prior to coating, the particles are arranged unattached to each other.

10. Method in accordance with claim 1, wherein a substrate having an applied or added height structure, preferably at least a depression or cavity added to the substrate and/or a structured layer arrangement applied to the substrate, is used for the carrier element.

11. Method in accordance with claim 10, wherein a substrate is used that comprises silicon, glass, or ceramic.

12. Method in accordance with claim 1, wherein elements that have at least ten times the average volume of a particle are also embedded and, during the coating process, are connected to the particles and the carrier element.

13. Method in accordance with claim 1, wherein after the arrangement of particles and carrier element have been coated, a cover layer is applied, at least in part, that preferably completely closes the shallow cavities.

14. Method in accordance with claim 1, wherein after at least part of the carrier element has been removed, the connected particles form a self-supporting structure on a remainder of the carrier element.

15. Method for producing a three-dimensional structure comprising:
a first step of applying unattached particles onto or into a carrier element, thereby forming a plurality of at least some interlinked cavities between the particles and the particles coming into contact with one another at points of contact,
a second step of coating the arrangement of particles and carrier element, at lease some of the cavities penetrated by a layer produced during the coating step, and at part or all of the particles being connected to one another at the points of contact,
wherein the carrier element is completely removed and the connected particles are applied to a different substrate.

16. Method for producing a three-dimensional structure comprising:
a first step of applying individual unattached particles onto or into a carrier element, thereby forming a plurality of at least some interlinked cavities between the particles and the particles coming into contact with one another at points of contact,
a second step of coating the arrangement of particles and carrier element, at least some of the cavities being penetrated by a layer produced during the coating process, and at least part of or all of the particles being connected to one another at the points of contact,
wherein, after part or all of the particles have been coated and connected, a cover layer is applied at least partly onto the arrangement of particles and carrier element and the particles or carrier element are subsequently at least partly removed.

* * * * *